US010515327B2

(12) United States Patent
Davis

(10) Patent No.: US 10,515,327 B2
(45) Date of Patent: Dec. 24, 2019

(54) BEVERAGE DISPENSING VALIDATION METHOD AND SYSTEM

(71) Applicant: Cornelius, Inc., St. Paul, MN (US)

(72) Inventor: Roland Derik Davis, St. Charles, IL (US)

(73) Assignee: Cornelius, Inc., Osseo, MN (US)

( * ) Notice: Subject to any disclaimer, the term of this patent is extended or adjusted under 35 U.S.C. 154(b) by 597 days.

(21) Appl. No.: 15/235,230

(22) Filed: Aug. 12, 2016

(65) Prior Publication Data

US 2017/0243430 A1 Aug. 24, 2017

Related U.S. Application Data

(60) Provisional application No. 62/298,812, filed on Feb. 23, 2016.

(51) Int. Cl.
  G06Q 10/06 (2012.01)
  G06F 17/50 (2006.01)
  G07F 13/06 (2006.01)
(52) U.S. Cl.
  CPC ....... G06Q 10/0633 (2013.01); G07F 13/065 (2013.01); *G06F 17/5009* (2013.01)
(58) Field of Classification Search
  CPC .... G06F 17/50; G06F 13/065; G06F 17/5009; G06Q 10/0633
  See application file for complete search history.

(56) References Cited

U.S. PATENT DOCUMENTS

| 5,192,000 | A  | * | 3/1993 | Wandrick | B67D 1/0037 222/129.3 |
|---|---|---|---|---|---|
| 6,058,986 | A  |   | 5/2000 | Bethuy et al. | |
| 6,449,966 | B1 |   | 9/2002 | Bethuy et al. | |
| 6,842,719 | B1 |   | 1/2005 | Fitzpatrick et al. | |
| 7,548,879 | B2 |   | 6/2009 | Cash et al. | |
| 7,809,534 | B2 | * | 10/2010 | Sturrock | G06F 17/5009 703/6 |
| 7,835,936 | B2 |   | 11/2010 | Ouimet et al. | |
| 8,069,021 | B2 | * | 11/2011 | Sturrock | G06F 17/5009 703/13 |

(Continued)

FOREIGN PATENT DOCUMENTS

| WO | 2011/066210 | 6/2011 |
|---|---|---|
| WO | 2014/143729 | 9/2014 |

OTHER PUBLICATIONS

Harrell, C. "Modeling Beverage Processing Using Discrete Event Simulation" Proceedings of 1993 Winter Simulation Conf., pp. 845-850 (1993) (Year: 1993).*

(Continued)

*Primary Examiner* — Jay Hann
(74) *Attorney, Agent, or Firm* — Andrus Intellectual Property Law, LLP

(57) ABSTRACT

A computer-implemented method of evaluating a beverage dispenser configuration includes the steps of providing operations data regarding beverage fulfillment operations and generating a beverage dispensing model based on the operations data. The method further includes providing a demand input to the beverage dispensing model to simulate, by a processor, the beverage fulfillment operations. At least one performance result is then calculated based on the simulation, and the performance result is displayed on a display.

20 Claims, 4 Drawing Sheets

(56) References Cited

U.S. PATENT DOCUMENTS

| | | |
|---|---|---|
| 8,620,753 B2 | 12/2013 | Burns et al. |
| 8,626,564 B2 | 1/2014 | Bippert et al. |
| 8,788,090 B2 | 7/2014 | Rothschild |
| 8,868,446 B2 | 10/2014 | Lamoureux et al. |
| 9,051,162 B2 | 6/2015 | Peters et al. |
| 9,092,768 B2 | 7/2015 | Breitenbach et al. |
| 9,218,614 B2 | 12/2015 | Lamoureux et al. |
| 9,262,776 B2 | 2/2016 | Lamoureux et al. |
| 2011/0220689 A1 | 9/2011 | Njaastad et al. |
| 2013/0001249 A1 | 1/2013 | Wiemer et al. |
| 2013/0060662 A1 | 3/2013 | Carlson et al. |
| 2014/0361041 A1 | 12/2014 | Hawken |
| 2015/0355810 A1 | 12/2015 | Abrach et al. |

OTHER PUBLICATIONS

Law, A. & McComas, M. "Secrets of Successful Simulation Studies" Proceedings of the 1991 Winter Simulation Conference, pp. 21-27 (1991) (Year: 1991).*

* cited by examiner

BEVERAGE DISPENSING VALIDATION METHOD AND SYSTEM

CROSS-REFERENCE TO RELATED APPLICATION

The present application is based on and claims priority to U.S. Provisional Patent Application Ser. No. 62/298,812 filed Feb. 23, 2016, the disclosure of which is incorporated herein by reference.

FIELD

The present disclosure relates to generally to the field of beverage dispensers, and more specifically to a method and a system for simulating and evaluating a beverage dispenser.

BACKGROUND

The following patents are incorporated herein by reference in their entireties. U.S. Pat. No. 6,058,986 discloses an electronic control for an automatic filling beverage dispensing valve. The dispensing valve includes a valve body, a flow control mechanism and a solenoid. The valve further includes an electrically conductive cup actuated lever for operating a micro-switch that is operatively connected to the electronic control of the present invention. The valve body includes a nozzle and a stainless steel electrical contact for providing electrical connection between the electronic control and the beverage as it flows through the nozzle into a cup. The electronic control of the present invention is microprocessor controlled and includes an internal signal generator which generates a signal independent of the input line frequency supplying the power to the control. This generated signal is buffered and applied to the dispensing cup lever while simultaneously being applied to a reference input of a phase-locked loop detector circuit. When beverage fills a cup to the rim thereof the beverage can flow over the rim and thereby provide an electrical continuity between the electrically conductive lever and the stainless steel contact within the nozzle. Thus, a signal is conducted to an input of the phase locked-loop detector circuit where that electrical signal is compared to the generated reference signal. If the two signals are matched in both frequency and phase, the detector circuit generates a continuity detected signal to the micro-processor. The microprocessor thereby ends dispensing by de-energizing the solenoid.

U.S. Pat. No. 6,449,966 discloses an electronic control for the operation of a beverage dispenser of the refrigerated ice bank type. The control provides for reliable determinations of when ice production is needed and when it is not needed. A microprocessor receives information from an ice bank probe and from a temperature probe located within the ice bank. Data collected by the microprocessor from both the ice bank probe and the temperature probe is used to determine if the ice bank is either insufficient in size and should be increased or is of sufficient size such that the compressor can be turned off. A carbonator level probe is also shown and connected to the microprocessor. The microprocessor is programmed whereby the carbonator probes are sampled in a manner to accurately determine the level of water in the carbonator and therefore the need for turning on or turning off any water pump connected thereto Both the operation of the compressor and the water pump are controlled by the microprocessor wherein the programming thereof provides for adequate hysteresis protection so that short cycling of the compressor and water pump is avoided.

U.S. Publication Application No. 2011/0220689 discloses an ice dispense system for an ice dispenser characterized by a chute having an ice receiving upper end in communication with an ice bin outlet passage and an ice dispensing lower end. Beginning with the chute filled with ice and its lower end closed, to dispense a selected quantity of ice, the chute lower end is opened for one of a plurality of different time periods, where each individual time period of the plurality is of a duration to dispense from the chute an associated predetermined quantity of ice. In response to dispensing ice from the chute, an agitator in the bin is operated for one of a plurality of different time periods, where each individual time period of the plurality is of a duration to move through the bin outlet passage and into the upper end of the chute an amount of ice substantially equal to that dispensed. The ice dispensing system is provided with an improved user interface and user programmable features U.S. Publication Application No. 2013/0001249 discloses a beverage dispense system having sensors for monitoring one or more characteristics relating to dispense of a beverage and outputting a signal representative of the or each monitored characteristic, and a control system responsive to signals received from the sensors for controlling operation of the dispense system.

U.S. Publication Application No. 2014/0361041 discloses a valve dispensing system that can be used in a beverage dispenser. In particular, the valve dispensing system has individual valve module components that control the flow of a beverage or beverage component, and a plurality of valve module components may be combined to form a system capable of dispensing a plurality of beverages and/or beverage components.

U.S. Publication Application No. 2015/0355810 discloses systems and method for beverage dispense from a plurality of users that include a beverage dispenser with a touch-sensitive graphical display. A computer of the beverage dispenser receives touch event data points and identifies one or more GUI sections of a plurality of GUI sections associated with the received touch event data points. The computer further operates to interpret a touch event input and provide a command responsive to the input to an associated dispensing unit.

SUMMARY

This Summary is provided to introduce a selection of concepts that are further described herein below in the Detailed Description. This Summary is not intended to identify key or essential features of the claimed subject matter, nor is it intended to be used as an aid in limiting the scope of the claimed subject matter.

In one embodiment, a computer-implemented method of evaluating a beverage dispenser configuration includes the steps of providing operations data regarding beverage fulfillment operations and generating a beverage dispensing model based on the operations data. The method further includes providing a demand input to the beverage dispensing model to simulate, by a processor, the beverage fulfillment operations. At least one performance result is then calculated based on the simulation, and the performance result is displayed on a display.

One embodiment of a system for evaluating a beverage dispenser configuration includes a processor, a display, and a simulation module that includes a beverage dispensing model of beverage fulfillment operations. The simulation module is executable on a processor to simulate the beverage fulfillment operations based on a demand input and display a visual depiction of the simulation on the display.

In one embodiment, a non-transitory computer readable medium has computer executable instructions stored thereon for evaluating a beverage dispenser configuration, where the instructions include the steps of accessing operations data in a compute. The operations data includes one of a dispenser configuration information, available beverages, beverage fulfillment steps, a time to complete each beverage fulfillment step, a total order volume, a peak order rate, beverage type metrics, flavor metrics, beverage size metrics, and beverages per order metrics. The instructions further include steps of generating in the computer a beverage dispensing model based on the operations data and providing a demand input to the beverage dispensing model to simulate, in the computer, beverage fulfillment operations. The instructions further include the steps comprising calculating in the computer at least one performance results based on the simulations, and displaying a visual depiction of the simulation and/or the performance result.

BRIEF DESCRIPTION OF THE DRAWINGS

Examples are described with reference to the following drawing figures. These same numbers are used throughout the figures to reference like features and components.

DETAILED DESCRIPTION

In the present disclosure, certain terms have been used for brevity, clearness and understanding. No unnecessary limitations are to be implied therefrom beyond the requirement of the prior art because such terms are used for descriptive purposes only and are intended to be broadly construed. The different systems and methods described herein may be used alone or in combination with other systems and devices. Various equivalents, alternatives and modifications are possible within the scope of the appended claims.

Speed of service and minimizing impact on consumers and crew is critical in food service operations, such as in fast food environments. Beverage dispensing, such as fountain beverage dispensing, is an important and time-consuming aspect of some food service operations, which include crew-serve applications (such as fast food drive-thru) and self-serve applications where consumers operate beverage dispensers to dispense their own beverage (such as in certain restaurants or convenience stores). The configuration of a beverage dispenser can play a key role in optimizing the speed and efficiency of beverage dispensing.

Through research studies and experimentation in the relevant field, the inventor has recognized the need for a way to assess fountain beverage dispenser configurations and operations to optimize fountain beverage configurations and assist in the development of new fountain beverage dispenser configurations. As new or additional brands, flavors, or dispensing mechanisms are being considered for inclusion in a food service user's operation, there is a need to understand the best solution to fit the user's operation and to predict the results of including or implementing such solutions, and to avoid implementing the wrong solution. Based on his recognition of the problems and challenges faced in the beverage dispensing industry, the present inventor developed the disclosed system 1 and method 100 to evaluate a particular beverage dispenser configuration in a user's environment via computer simulation and/or to speed up the concept development process, while avoiding negative customer service and profit impacts of moving the wrong dispensing solution into a user's operation.

Figure 1:
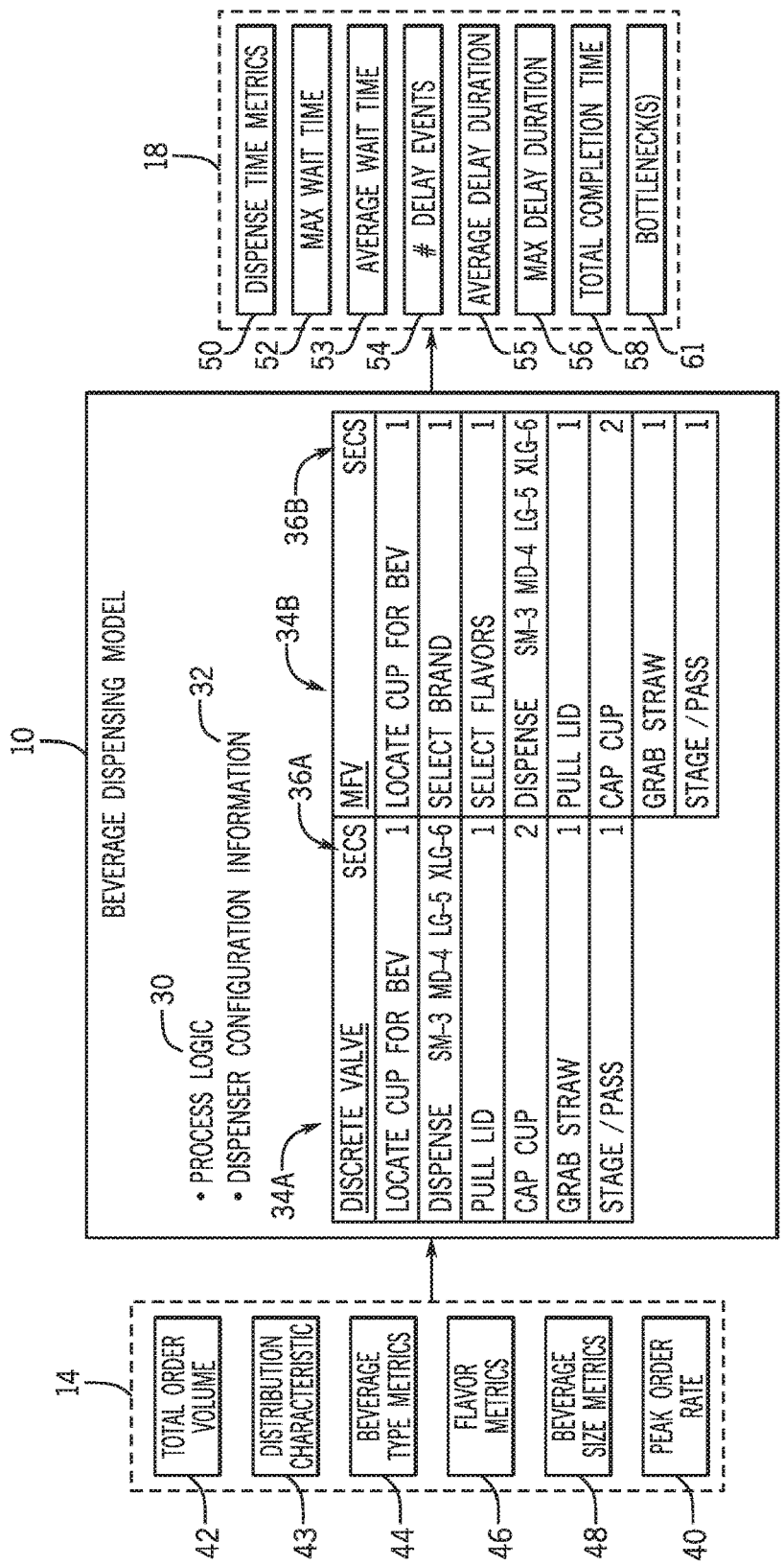
FIG. 1 is a schematic diagram of one embodiment of a system and method for evaluating a beverage dispenser configuration.
Figure 2:
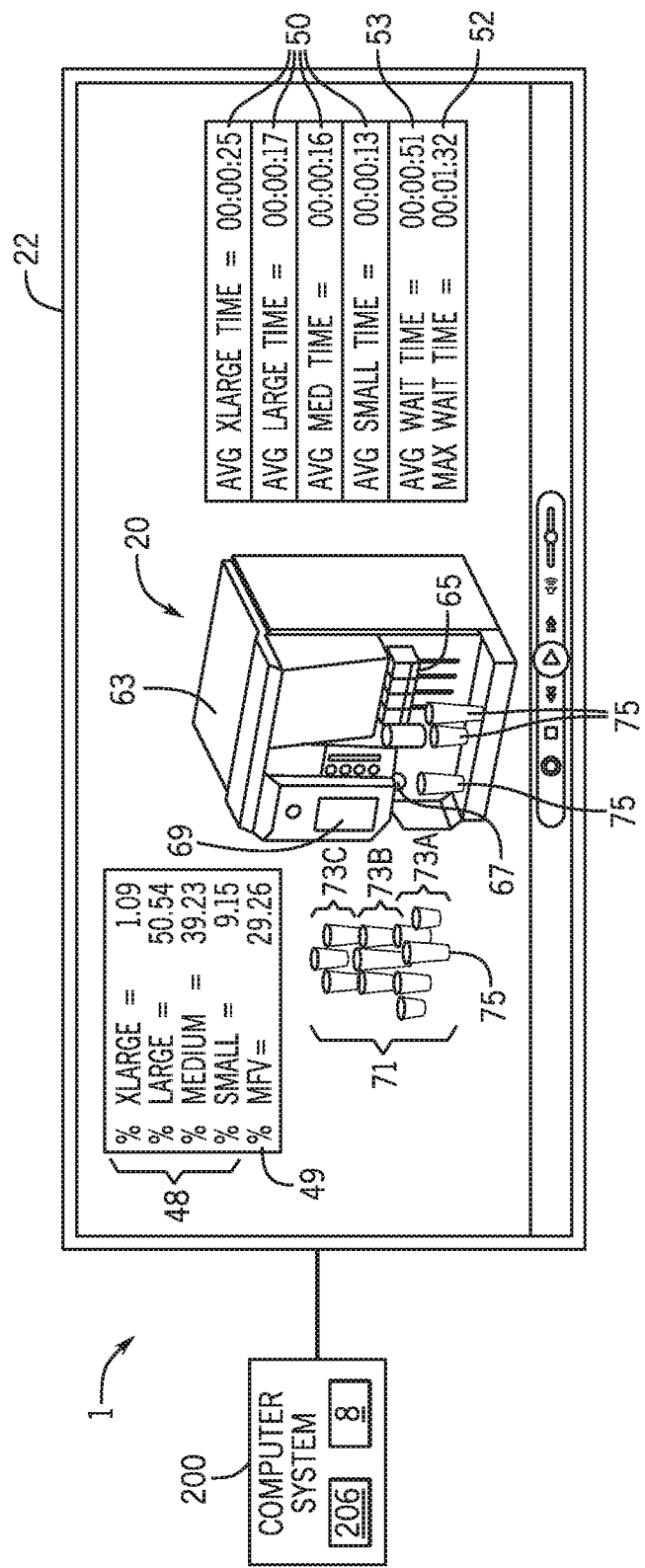
FIG. 2 depicts a schematic diagram of one embodiment of a system for evaluating a beverage dispenser configuration providing a visual depiction of a beverage dispensing simulation and performance results.

As exemplified in FIGS. 1 and 2, a beverage dispensing model 10 is built as a computer simulation of beverage fulfillment operations, including the operations involving using a particular beverage dispenser 63 dispense beverages. That beverage dispensing model 10 is then used to simulate, test, and/or evaluate one or more beverage dispenser configurations under various constraints. The beverage dispensing model 10 is configured to receive and process a demand input 14 containing beverage-order-related information (such as beverage type, beverage size, etc.) and to provide output in the form of one or more performance results 18 providing information that assesses the performance of the beverage fulfillment operations, and especially regarding the performance of the beverage dispenser 63 modeled in those operations. A visual depiction 20 of the simulation may be generated and simultaneously or subsequently displayed on a display 22.

The beverage dispensing model 10 is built based on operations data 12 (see FIG. 4), such as of a user's beverage fulfillment operations. The operations data 12 may include information regarding the process and throughput of the particular beverage fulfillment operations, which provide a basis for generating the beverage dispensing model 10 that simulates those beverage fulfillment operations. For example, as described in more detail below, the operations data 12 may include dispenser configuration information 32 regarding a particular dispenser 63 configuration used in the modeled beverage fulfillment operations. Further, the beverage dispensing model 10 may be generated based on a process logic 30 that associates the various operations data 12 into a series of logical statements, such as an order that operations steps are executed, a priority of operations steps, actions that can be executed simultaneously versus sequentially, etc. As will be understood by a person having ordinary skill in the relevant art, multiple simulation software tools and environments are available that could be adapted according to such a process logic 30 and other operations data 12 as described herein.

In one embodiment, the beverage dispensing model 10 may be part of a simulation module 8 that is a software module executable on one or more processors 206 within a computer system 200. The simulation module 8 which includes the beverage dispensing model 10, is a set of computer-executable instructions, or code, executable on the processor 206 to execute the steps and generate performance results 18 as described herein. The computing system 200 may control a display 22 to display a visual depiction 20 of the simulation using the beverage dispensing model 10.

For example, the beverage dispensing model 10 may be built to model a user's particular beverage fulfillment operations by using operations data 12 taken from that user's actual operations. Such user-specific operations data 12 may be gathered and supplied by any of various means. For example, certain operations data 12 may be collected by and extracted from a user's point-of-sale software that tracks a user's orders and sales. For instance, operations data 12 such as total order volume 42, beverage type metrics, 44, flavor metrics 46, beverage size metrics 48, and peak order rate 40 may be available from the user's point-of-sale software. For example, the point-of-sale software may comprise or access a database 6 in which such operations data 12 may be stored within a user's computer system 200 or elsewhere. Other operations data 12, such as dispenser configuration information 32 and/or beverage fulfillment steps and times, may be tracked or gathered by other means and provided to the computer 200.

The accuracy of the beverage dispensing model 10 of a user's operations may be verified and tested using demand input 14 that is based on the actual demand recorded for that user's beverage dispensing operations and beverage dispenser configuration. The beverage dispensing model 10 can then be used to simulate tests and evaluate the user's current beverage fulfillment operations and beverage dispenser 63 configuration, such as by varying the demand inputs 14 and using the beverage dispensing model 10 to generate performance results 18 based on those demand inputs 14. For example, the beverage dispensing model 10 can be implemented to identify a maximum demand that a particular beverage dispenser 63 can effectively handle, or to identify bottlenecks 61, or causes of delay, in the user's current beverage fulfillment operations. Based on the identification of the one or more bottlenecks 61, improved fulfillment operations and/or beverage dispenser configurations can be identified and/or developed. Alternatively or additionally, the beverage dispensing model 10 may be used to identify a beverage dispenser configuration that is optimal under a given user's operating constraints and demands and/or projected operating constraints and demands, such as to identify the beverage dispenser configuration that offers the shortest dispense duration or wait time, and/or minimizes delay events.

As will be known to a person having ordinary skill in the relevant art, numerous beverage dispensers having a multitude of different configurations are available and implemented in the food and concession services fields for dispensing one or more liquid beverages from a nozzle into a cup or other container, including beverage dispensers regarded in patent disclosures incorporated herein. To provide one example, a beverage dispenser 63 may have a plurality of beverage sources containing beverage components. The beverage components are combined into a dispensed beverage comprising at least one diluent, such as water or soda (carbonated water), and at least one flavoring, such as a flavored syrup. In an alternative embodiment, the beverage dispenser 63 may be comprised of beverage sources having premixed beverage products therein, and thus may only require dispensing from one beverage source during any given dispense session. The flow of beverage from each beverage source and from the beverage dispenser 63 as a whole is controlled by one or more flow valves operatively connected to the respective beverage source, such as a multi-flavor valve 67 or a discrete valve 65 as described below. Additionally, the beverage dispenser 63 may include an ice dispenser to store and dispense ice into the beverage container.

In one embodiment, the beverage dispensing model 10 is created on operations data 12 regarding beverage fulfillment operations, such as operations data 12 collected on a user's current beverage dispensing operations. For example, operations data may include dispenser configuration information 32 (such as a list of available beverages, beverage fulfillment steps, a time to complete each beverage fulfillment step, a total order volume, an order rate, beverage type metrics, flavor metrics, beverage size metrics, and averages per order metrics). Dispenser configuration information 32 includes information describing a beverage dispenser 63, such as available valves and the type of each available valve—e.g., a number of discrete valves 65 and multi-flavor valves 67 incorporated in the modeled beverage dispenser 63. A discrete valve 65 is a designated valve for a particular fountain beverage, which is exemplified in the visual depiction 20 of the exemplary beverage dispenser 63 in FIG. 2. The exemplary beverage dispenser 63 also has a multi-flavor valve 67, which is a valve that dispenses any of multiple fountain beverages out of a single dispense location. The multi-flavor valve 67 is associated with a user interface 69 through which an operator inputs, or controls, the beverage dispense from the multi-flavor valve 67. To provide just a few examples, the user interface 69 may be a touch screen or a set of membrane switches.

Further, the exemplary dispenser configuration information 32 includes which beverages are available through which dispensing mechanisms, such as through each discrete valve 65 and/or multi-flavor valve 67. Further dispenser configuration information 32 may include a list of the available beverages and flavor additives provided by the respected beverage dispenser 63, such as the beverage types available (e.g., brands such as Coke, Diet Coke, Pepsi, Diet Pepsi, Sprite, and/or generic beverage elements such as water, soda, orange juice, and/or flavors such as cherry, vanilla, lemon, etc.), as well as the input mechanisms through which the user can select each of the beverage types for dispense. In a further example, the dispenser configuration information 32 may include a layout of the user interface 69 for the multi-flavor valve 67 or of any other user interface or input device provided on the beverage dispenser 63.

The operations data 12 may include beverage fulfillment steps, which are the steps of the beverage fulfillment operations being modeled. As exemplified in FIG. 1, multiple sets of beverage fulfillment steps 34a, 34b may be associated with a beverage dispenser 63, such as different steps that may be executed for dispensing from the different available valves 65, 67 or different steps required for dispensing different beverage types. A list of exemplary beverage fulfillment steps 34a are provided for fulfillment from a discrete valve 65, and list beverage fulfillment steps 34b are provided from the multi-flavor valve 67. A time 36a, 36b in seconds to complete each of the listed beverage fulfillment steps 34a, 34b is provided adjacently. The time 36a, 36b to complete each of the beverage fulfillment steps 34a, 34b may be determined in any number of ways, such as by observation or experimentation within a user's fulfillment operations, or as an educated guess made based on such steps in similar fulfillment operations, or as an estimation made based on known average execution times for the relevant steps.

The operations data 12 may include a total order volume 42, which may be a total number of orders over a period of time (such as an hour, a day, or a week) that can provide reasonably accurate sample information of the order demand experienced as part of a user's beverage fulfillment operations. Further, the operations data 12 may include a beverages per order metric, such as a percentage breakdown of the number of beverages in each order based on the total order volume 42 (e.g., 30% of orders include one beverage, 30% of orders include two beverages, 15% of orders include three beverages, etc.). In other embodiments, each beverage may be treated as a single order for purposes of the operations data 12.

The operations data 12 may further include a peak order rate 40 value, such a maximum number of drink orders per unit time (four orders per minute) or a minimum interval of drink orders (one order every 15 seconds) processed by the beverage fulfillment operations for a user. Alternatively or additionally, the operations data 12 may include beverage type metrics 44, such as a breakdown by percentage of the user's total order volume of the type of beverage requested in each order (e.g., 10% Coke, 15% Diet Coke, 10% Sprite, 5% water, etc.). Similarly, the operations data 12 may include beverage size metrics 48, such as the percent of total beverages comprising each beverage size (e.g., 20% small, 30% medium, 30% large, 20% extra large). Likewise, the operations data 12 may also include flavor metrics 46 about the availability and use of flavor additives, such as flavored syrups. For example, the flavor metrics may include a percent of the total order volume 42 that includes a flavor additive, and may further include a breakdown of such flavor additives ordered (e.g., 10% cherry, 5% vanilla, 2% lemon, etc.).

The beverage dispensing model 10 conducts a simulation based on the demand input 14 to generate one or more performance results 18. The performance results 18 provide information relevant to the performance of the model beverage dispenser 63 under the given demand input 14. For example, the one or more performance results may include dispense time metrics 50, such as an amount of time taken to fill each beverage size and/or beverage type. Exemplary dispense time metrics 50 may be represented in any number of ways, such as an average or median dispense time for each available beverage size, an average or mean dispense time for each beverage type, and average or median time for dispense from each type of valve (such as the discrete valve 65 and/or multi-flavor valve 67), etc. For example, dispense time may be measured from the initiation of the first beverage fulfillment step 34a, 34b through completion of the last beverage fulfillment step 34a, 34b, and in such an embodiment would not include any delays prior to initiation of the first beverage fulfillment step 34a, 34b. In other embodiments, the dispense time may be measured from the placement of the order to the completion of the dispensing for that order.

The performance results 18 may further include metrics regarding wait time, such as maximum wait time 52 and/or an average wait time 53 (which could equally be median wait time). The performance results 18 may further include information regarding any delays in the beverage dispense process, which is where a beverage dispensing step 34a, 34b is held up due to a bottleneck 61 in the process. Such information regarding delays may include a number of delay events 54, such as the number of times that a delay occurred during the dispensing of the total order volume 42, an average delay duration 55 (the average amount of time for the number of delay events 54), or a maximum delay duration 56 (the maximum time, or longest delay, out of all of the number of delay events 54). The performance results 18 may also identify the causes of the delay events, bottlenecks 61, such as identifying where in the beverage fulfillment steps 34a, 34b the delay occurred and/or the demand inputs 14 that caused the delay to occur. To provide an exemplary illustration, the bottleneck 61 identification may indicate that delays occurred, and thus a bottleneck 61 exists, where three or more orders come in requiring dispensing from a particular dispense valve, such as the multi-flavor valve 67, within a particular period. Likewise, bottlenecks 61 may identify that a particular beverage type causes the most frequent delay, such as that the lowest delays were caused by orders of Pepsi. For example, the demand input 14 may model the peak demand seen by a user to best identify the bottlenecks 61 within a user's beverage fulfillment operations employing the given beverage dispenser 63 configuration. The performance results 18 may also include a total completion time 58, which is the total time it took to complete the total order volume 42 of the demand input 14.

The demand input 14 provided to the beverage dispensing model 10 may be based on a demand recorded for a user, such as a user's beverage fulfillment operations that are being modeled. As illustrated in FIG. 1, a demand input 14 may include values from the user's operations data 12, such as a total order volume 42, beverage type metrics 44, flavor metrics 46, beverage size metrics 48, and peak order rate 40. As described above, these values may be recorded by and extracted from a user's point-of-sale software, for example. Accordingly, where the demand input 14 matches the user's actual process, the performance result 18 should match the actual performance of the beverage fulfillment operations experienced by the user, such as depicting the actual dispense time metrics, wait times, delays, and bottlenecks resulting in the user's day-to-day operations. If that is not the case, then the beverage dispensing model 10 can be modified during the generation process so that the performance results 18 accurately reflect the performance results seen by the user in the actual practice of their beverage fulfillment operations for a given demand input 14. Accordingly, the beverage dispensing model 10 can be tested, adjusted, and verified to accurately reflect a user's beverage fulfillment operations.

Once an accurate beverage dispensing model 10 has been developed, the demand inputs 14 can be adjusted to evaluate a particular beverage dispenser configuration and/or determine whether another beverage dispenser configuration would provide better performance results 18 based on a user's demand input 14. For example, the demand input 14 may be a randomized input based on one or more of the total order volume 42, the beverage type metrics 44, flavor metrics 46, beverage size metrics 48, and peak order rate 40. And any one or more of those values can be adjusted to test the limits of the beverage dispenser 63 configuration modeled by the beverage dispensing model 10. The demand input 14 may include a distribution characteristic 43 that dictates the randomization algorithm and constraints of a random number generator. For instance, the demand input 14 may be generated by a random number generator using a Monte Carlo computational algorithm to produce a total order volume 42 that generally has the characteristics of the beverage type metrics 44, flavor metrics 46, beverage size metrics 48, and peak order rate 40. The demand input 14 can be varied by adjusting one or more of the randomization constraints—e.g., adjusting the beverage type metrics 44, flavor metrics 46, beverage size metrics 48, and peak order rate 40, etc.—to determine stress points, such as potential bottlenecks of the beverage dispenser configuration modeled by the beverage dispensing model 10. Likewise, the demand input 14 can be adjusted to depict potential or predicted future demand, and thus allow a user to test how its particular beverage dispenser 63 configuration would perform in that demand scenario.

Further, the beverage dispensing model 10 may be adjusted to incorporate a test parameter 16, such as one or more process steps describing another beverage dispenser 63 configuration. The test parameter 16 may describe, for example, adding, removing, or changing a discrete valve 65, a beverage type, or a flavor of the original beverage fulfillment operations. The process logic 30 and dispenser configuration information 32 may be adjusted to test a beverage dispenser 63 configuration that a user is considering implementing. For instance, the dispenser configuration information 32 and the process logic 30 may be adjusted to add or remove a discrete valve 65 from the modeled beverage dispenser 63, or to model changing the beverage type dispensed from one or more of the discrete valves 65.

In various embodiments, one or more modified beverage dispensing models 10x, 10y may be generated, and the modified beverage dispensing models 10x, 10y can be tested against the original beverage dispensing model 10 by running the same demand inputs 14 through each of the models and comparing the performance results 18 against the test performance results 18x, 18y outputted by the modified beverage dispensing models 10x, 10y. Accordingly, multiple beverage dispenser 63 configurations can be compared to determine an optimal beverage dispenser configuration. As exemplified in FIG. 3, a single demand input 14 may be provided to the beverage dispensing model 10 and to the modified beverage dispensing models 10x and 10y. For example, the beverage dispensing model 10 may model a user's current beverage dispenser configuration, and each of the modified beverage dispensing models 10x and 10y may model a different modification to the user's current beverage dispenser 63 configuration.

Figure 3:
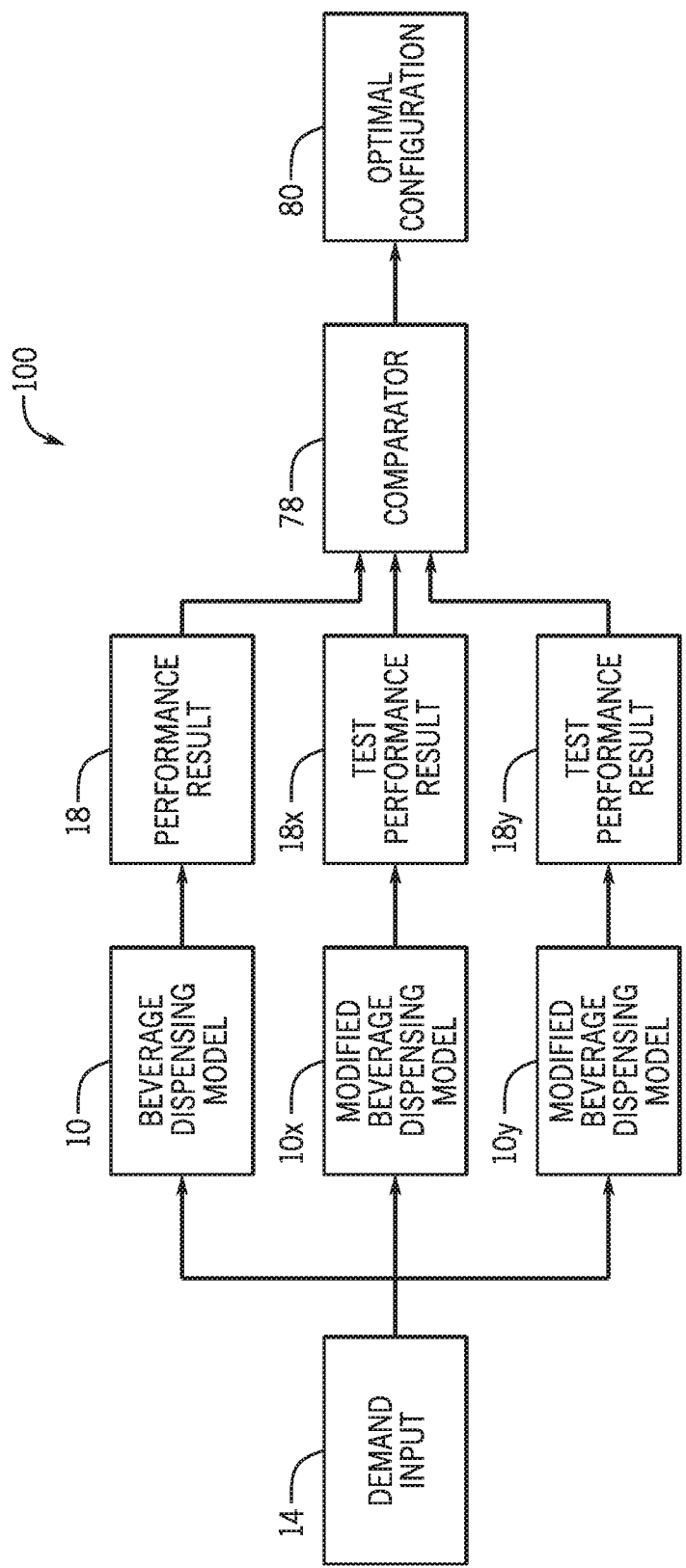
FIG. 3 is a flow chart depiction of one embodiment of a method and system for evaluating a beverage dispenser configuration.

In reference to FIGS. 2 and 3, where the beverage dispensing model 10 models beverage fulfillment operations using the depicted beverage dispenser 63 configuration, a corresponding modified beverage dispensing model 10x may model a variant of the beverage dispenser 63 configuration adding a fifth discrete valve 65 that dispenses a particular beverage type (e.g., Pepsi), and another modified beverage dispensing model 10y may model a variant of the beverage dispenser 63 configuration where the least used one of the four discrete valves 65 is changed from its existing dispensed beverage type to dispense the most ordered beverage type (e.g., Pepsi) instead. The beverage dispensing model 10 produces performance result 18, and each of the modified beverage dispensing models 10x and 10y produce test performance results 18x and 18y, for the given demand input 14. The performance results 18, 18x, 18y are then compared at comparator 78, such as by an algorithm in the simulation module 8, to determine which beverage dispensing model 10, 10x, 10y provides an optimal performance for the given demand input 14. If the demand input 14 is modeled after the user's peak demand, then the process will allow determination of the beverage dispensing configuration that will yield the best performance result during the user's peak demand times.

In addition to the performance results 18, the computer system 200 running the simulation module 8 may generate a visual depiction 20 of the simulation based upon the demand input 14. FIG. 2 depicts a screenshot of an exemplary visual depiction 20 provided on a display 22. The visual depiction 20 presents a visual representation of the modeled beverage dispenser 63 configuration, which in the depicted embodiment has four discrete valves 65 and one multi-flavor valve 67, and may provide an animation of the demand input 14 orders being processed in the beverage dispensing model 10. As illustrated in the figure, the each beverage may be represented by a drink icon 75 traveling through the respective beverage fulfillment steps 34a, 34b on the modeled beverage dispenser 63.

The display 22 also may display information regarding the demand input 14. In FIG. 2, the display provides the beverage size metrics 48 of the demand input 14 being run on the beverage dispensing model 10, where 1.09% of the beverages in the orders are extra large, 50.54% are large, 39.23% are medium, and 9.15% are small. In the depicted example, the display provides an additional demand input characteristic of a multi-flavor valve percent 49, which describes the percent of beverages in the total order volume 42 of the demand input 14 that are dispensed from the multi-flavor valve 67.

The screenshot of the visual depiction 20 shown in FIG. 2 visually depicts a dispense backlog 71, or delay, that exists at one moment in the simulation. Each row 73a-73c depicts one order awaiting fulfillment, and thus contains a number of drink icons 75 that corresponds with the number of beverages within the respective order. In the depicted embodiment, the drink icons 75 are sized to represent the respective beverage size ordered. Thus, the order represented in the bottom row 73a contains six beverages of various depicted sizes, the next order represented at 73b contains three beverages, the next order represented at 73c also contains three beverages, and so on. The bottom row 73a of drink icons 75 describes the longest pending order that has not yet been completed. The middle row 73b of drink icons represents the next order in time, and the top row 73c is the most recently placed order (and thus the last order in the queue). In such an embodiment, each delayed order may be a delay event counted in the number of delay events 54.

The visual depiction 20 represented at FIG. 2 shows each beverage in each order going through each beverage fulfillment step 34a, 34b. Accordingly, any delay event within the process will be visually apparent in the visual depiction 20, and bottlenecks occurring in the simulation may be visually revealed. The exemplary display 22 also depicts exemplary performance results 18 including dispense time metrics 50 showing an average dispense time for each available beverage size. Also shown are the average wait time 53 and the max wait time 52. For example, the performance results 18 shown in the exemplary display 22 may be the current tallies based on the demand inputs processed so far in the simulation. In an alternative embodiment, the displayed performance results may be the final output after all of the demand inputs 14 are processed in the beverage dispensing model 10.

Referencing FIG. 3, the simulation module 8 may automatically compare the performance results 18, 18x, 18y using a comparator algorithm 78 to determine an optimal beverage dispenser configuration 80 from the three beverage dispenser configurations modeled in the beverage dispensing models 10, 10x, 10y. In other embodiments, the simulation module 8 may allow a user to make such a comparison themselves by displaying the performance results 18, 18x, 18y in a way that facilitates the user's comparison.

Figure 4:
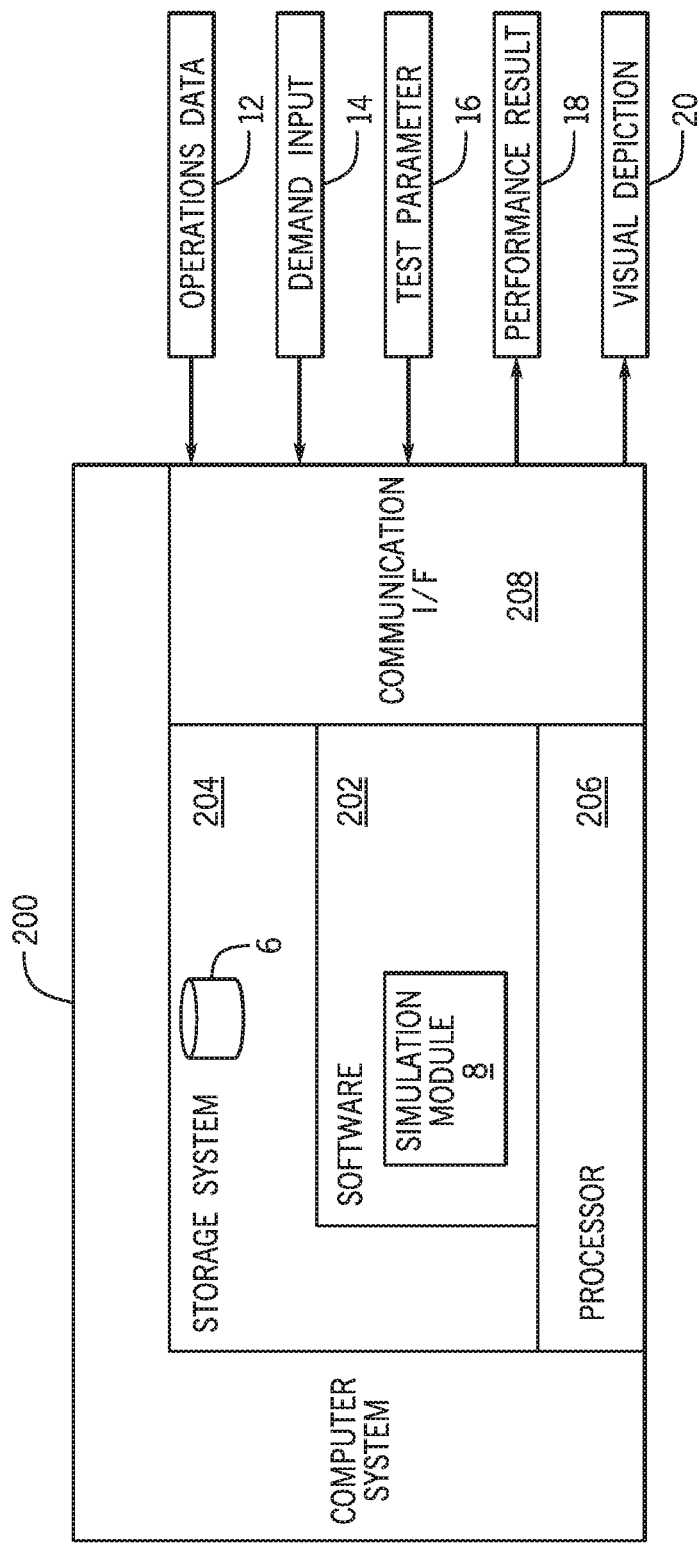
FIG. 4 depicts one embodiment of a computer implemented in a system for evaluating a beverage dispenser configuration.

FIG. 4 provides a system diagram of an exemplary computer system 200 for the system 1 for evaluating a beverage dispenser. The computer system 200 is configured to execute simulation module 8 to provide evaluations, comparisons, and optimizations described herein. The computer system 200 that includes a processor 206, storage system 204, software 202, and communication interface 208. The processor 206 loads and executes software 202 from the storage system 204, including the simulation module 8, which is an application within the software 202. The simulation module 8 includes computer-readable instructions that, when executed by the computer system 200 (including the processor 206), direct the processor 206 to operate as described in herein in further detail, including to execute the simulation using the beverage dispensing model 10.

Although the computer system 200 as depicted in FIG. 4 includes one software 202 encapsulating one simulation module 8, it should be understood that one or more software elements having one or more modules may provide the same operation. Similarly, while description as provided herein refers to a computer system 200 and a processor 206, it is to be recognized that implementations of such systems can be performed using one or more processors, which may be communicatively connected, and such implementations are considered to be within the scope of the description.

The processor 206 can comprise a microprocessor and other circuitry that retrieves and executes software 202 from storage system 204. Processing system 206 can be implemented within a single processing device but can also be distributed across multiple processing devices or sub-systems that cooperate in executing program instructions. Examples of processor 206 include general purpose central processing units, applications specific processors, and logic devices, as well as any other type of processing device, combinations of processing devices, or variations thereof.

The storage system 204, which includes database 6, can comprise any storage media, or group of storage media, readable by processor 206, and capable of storing software 202. The storage system 204 can include volatile and non-volatile, removable and non-removable media implemented in any method or technology for storage of information, such as computer-readable instructions, data structures, program modules, or other data. Storage system 204 can be implemented as a single storage device but may also be implemented across multiple storage devices or sub-systems. For example, the software 202 may be stored on a separate storage device than the database 6. Likewise, database 6 can be stored, distributed, and/or implemented across one or more storage media or group of storage medias. Similarly, database 6 may encompass multiple different sub-databases at different storage locations and/or containing different information which may be stored in different formats. By way of example, the database 6 may store operations data 12 collected by point-of-sale software of the user. Storage system 204 can further include additional elements, such as a controller capable of communicating with the processor 206.

Examples of storage media include random access memory, read only memory, magnetic discs, optical discs, flash memory, virtual memory, and non-virtual memory, magnetic sets, magnetic tape, magnetic disc storage or other magnetic storage devices, or any other medium which can be used to storage the desired information and that may be accessed by an instruction execution system, as well as any combination or variation thereof, or any other type of storage medium. Likewise, the storage media may be housed locally with the processor 206, or may be distributed in one or more servers, which may be at multiple locations and networked, such as in cloud computing applications and systems. In some implementations, the storage media can be a non-transitory storage media. In some implementations, at least a portion of the storage media may be transitory.

The communication interface 208 is configured to communicate with various aspects of the system 1, such as the display 22, as well as other systems or devices, such as point-of-sale software and or a user input device wherein a user can input the operations data 12, demand input 14 constraints, test parameter 16 information, etc. The communication interface 208 may, for example, act to send display commands to display 22 to provide the visual depiction 20 and/or display the performance result 18 thereon. As will be understood by a person having ordinary skill in the art, the display 22 may be any graphical display device capable of interfacing with computer system 200, such as an LED display, a plasma display, a plasma display panel, an LCD device, to provide just a few examples. The system 1 may also incorporate other user interface devices, such as a mouse, a keyboard, a voice input device, a touch input device for receiving a gesture from a user, a motion input device for detecting non-touch gestures and other motions by a user, and other comparable input devices and associated processing elements capable of receiving input from a user. Speakers, printers, haptic devices and other types of output devices may also be included in the system 1.

This written description uses examples to disclose the invention, including the best mode, and also to enable any person skilled in the art to make and use the invention. Certain terms have been used for brevity, clarity and understanding. No unnecessary limitations are to be inferred therefrom beyond the requirement of the prior art because such terms are used for descriptive purposes only and are intended to be broadly construed. The patentable scope of the invention is defined by the claims, and may include other examples that occur to those skilled in the art. Such other examples are intended to be within the scope of the claims if they have features or structural elements that do not differ from the literal language of the claims, or if they include equivalent features or structural elements with insubstantial differences from the literal languages of the claims.

What is claimed is:

1. A computer-implemented method of evaluating a beverage dispenser configuration, the method comprising:
   providing operations data regarding beverage fulfillment operations;
   generating a beverage dispensing model based on the operations data and dispenser configuration information, wherein the dispenser configuration information includes at least one of a beverage source configuration, a valve type, and a beverage component configuration;
   providing a demand input to the beverage dispensing model to simulate, by a processor, the beverage fulfillment operations;
   calculating, by the processor, at least one performance result based on the simulation; and
   displaying the performance result on a display.

2. The method of claim 1, wherein the performance result includes at least one of a dispense time metric, a maximum wait time, an average wait time, a number of delay events, an average delay duration, a maximum delay duration, and a total completion time for a total trial order volume.

3. The method of claim 1, further including identifying one or more bottlenecks in the beverage fulfillment operations.

4. The method of claim 1, further comprising determining an optimal beverage dispenser configuration for the beverage fulfillment operations based on the performance result.

5. The method of claim 1, wherein operations data includes at least one of a list of available beverages, beverage fulfillment steps, a time to complete each beverage fulfillment step, a total order volume, a peak order rate, beverage type metrics, flavor metrics, beverage size metrics, and beverages per order metrics.

6. The method of claim 5, wherein the demand input is a randomized input based on one or more of the total order volume, the order rate, the beverage type metrics, the flavor metrics, the beverage size metrics, and the beverages per order metrics.

7. The method of claim 6, wherein the operations data describes a user's current beverage fulfillment operations.

8. The method of claim 1, further comprising:
modifying the beverage dispensing model to include at least one test parameter value regarding modified beverage fulfillment operations; and
providing the demand input to the modified beverage dispensing model to generate at least one test performance result.

9. The method of claim 8, further comprising comparing at least the performance result and the test performance result to determining an optimal configuration of a beverage dispenser for the user.

10. The method of claim 8, wherein the test parameter value describes adding, removing, or changing a discrete valve or a beverage type on the beverage dispenser configuration.

11. The method of claim 1, further comprising generating a visual depiction of the beverage dispensing simulation, and displaying the visual depiction on the display.

12. A system for evaluating a beverage dispenser configuration, the system comprising:
a processor;
a display;
a simulation module including a beverage dispensing model of beverage fulfillment operations, the simulation module executable on the processor to:
simulate the beverage fulfillment operations based on dispenser configuration information and a demand input, wherein the dispenser configuration information includes at least one of a beverage source configuration, a valve type, and a beverage component configuration; and
display a visual depiction of the simulation on the display.

13. The system of claim 12, wherein the beverage dispensing model is further based on at least one of a list of available beverages, beverage fulfillment steps, a time to complete each beverage fulfillment step, a total order volume, a peak order rate, beverage type metrics, flavor metrics, beverage size metrics, and beverages per order metrics.

14. The system of claim 12, wherein the simulation module is further executable on the processor to calculate at least one performance result, wherein the performance result includes at least one of a dispense time metric, a maximum wait time, an average wait time, a number of delay events, an average delay duration, a maximum delay duration, and a total completion time for a total trial order volume.

15. The system of claim 14, wherein the simulation module is further executable on the processor to identify one or more bottlenecks in the beverage fulfillment operations.

16. The system of claim 12, wherein the demand input is a randomized input based on one or more of a total order volume, the order rate, the beverage type metrics, the flavor metrics, the beverage size metrics, and the beverages per order metrics.

17. A non-transitory computer readable medium having computer executable instructions stored thereon for evaluating a beverage dispenser configuration, wherein the instructions include the steps comprising:
accessing operations data in a computer, wherein the operations data includes least two of dispenser configuration information, a list of available beverages, beverage fulfillment steps, a time to complete each beverage fulfillment step, a total order volume, a peak order rate, beverage type metrics, flavor metrics, beverage size metrics, and beverages per order metrics;
generating in the computer a beverage dispensing model based on the operations data and dispenser configuration information, wherein the dispenser configuration information includes at least one of a beverage source configuration, a valve type, and a beverage component configuration;
providing a demand input to the beverage dispensing model to simulate, in the computer, beverage fulfillment operations;
calculating in the computer at least one performance result based on the simulation; and
displaying at least one of a visual depiction of the simulation and the performance result.

18. The non-transitory computer readable medium of claim 17, further having computer executable instructions including the steps comprising:
modifying the beverage dispensing model to include at least one test parameter value regarding modified beverage fulfillment operations;
providing the demand input to the modified beverage dispensing model to simulate, in the computer, the modified beverage fulfillment operations and to generate at least one test performance result; and
displaying the test performance result.

19. The non-transitory computer readable medium of claim 18, wherein the performance result and the test performance result each include at least one of a dispense time metric, a maximum wait time, an average wait time, a number of delay events, an average delay duration, a maximum delay duration, and a total completion time for a total trial order volume.

20. The non-transitory computer readable medium of claim 17, further having computer executable instructions including the steps comprising identifying one or more bottlenecks in the beverage fulfillment operations.

* * * * *